United States Patent [19]

Lazzaroni et al.

[11] Patent Number: 4,663,001

[45] Date of Patent: May 5, 1987

[54] ELECTROCONDUCTIVE POLYMERS DERIVED FROM HETEROCYCLES POLYCYCLIC MONOMERS AND PROCESS FOR THEIR MANUFACTURE

[75] Inventors: Roberto Lazzaroni, Sambreville; Joseph Riga, Andenne; Jacques Verbist, Namur, all of Belgium

[73] Assignee: Solvay & Cie. (Societe Anonyme), Brussels, Belgium

[21] Appl. No.: 743,647

[22] Filed: Jun. 11, 1985

[30] Foreign Application Priority Data

Jun. 15, 1984 [BE] Belgium ............... 0/213150

[51] Int. Cl.⁴ ................................................. C25B 3/02
[52] U.S. Cl. ................................ 204/78; 204/59 R; 204/59 QM; 204/294; 428/367; 428/411.1; 428/457; 428/539.5; 428/688; 548/453; 549/50; 540/1
[58] Field of Search ............... 428/688, 539.5, 411.1, 428/457, 367; 204/78, 59 R, 59 QM, 294; 260/239 R; 548/453; 549/50

[56] References Cited

U.S. PATENT DOCUMENTS

| | | | |
|---|---|---|---|
| 3,574,072 | 4/1971 | Louvar | 204/72 |
| 4,472,488 | 9/1984 | Maxfield et al. | 429/216 |
| 4,536,262 | 8/1985 | Wegner et al. | 204/78 |
| 4,544,456 | 10/1985 | Skotheim | 204/59 R |
| 4,547,270 | 10/1985 | Naarminn | 204/59 R |

FOREIGN PATENT DOCUMENTS 43060  9/1982  Japan ...................... 204/78

OTHER PUBLICATIONS

A. Diaz, *Chemica Scripta*, 1981, vol. 17, pp. 145-148.
K. Kanazawa et al, *Synthetic Metals*, vol. 1, 1979/80, pp. 329-336.
T. Ito et al, *J. Poly. Sci.: Polym. Chem. Ed.*, 1974, vol. 12, pp. 11-20.
H. Shirakawa et al, *Journal de Physique*, Colloquium C3, Supplement to No. 6, vol. 44, Jun. 1983, pp. C3-3 to C3-10.
H. Hemetsberger et al, *Monat. Chem.*, vol. 103, 1972, pp. 194-204.
R. Gleiter et al, *J. Org. Chem.*, vol. 42, No. 13, 1977, pp. 2230-2237.
Ahlgren et al, *J. Chem. Soc., Chem. Commun.*, 1984, pp. 946-948.
R. Lazzaroni et al, *J. Chem. Soc.*, Perkin Trans. II, 1985, pp. 97-102.

*Primary Examiner*—R. L. Andrews
*Attorney, Agent, or Firm*—Spencer & Frank

[57] ABSTRACT

Electrically conductive polymers derived from heterocyclic polycyclic monomers formed of at least two cycles of five condensed members, each cycle containing one heteroatom, as well as a method of electrochemical polymerization by anodic oxidation of these monomers. These polymers may become part of composite electroconductive material.

18 Claims, No Drawings

ELECTROCONDUCTIVE POLYMERS DERIVED FROM HETEROCYCLES POLYCYCLIC MONOMERS AND PROCESS FOR THEIR MANUFACTURE

The present invention relates to electrically conductive polymers derived from heterocyclic polycyclic monomers, as well as to a method for preparing them.

The invention also relates to composite electroconductive materials including polymers derived from these monomers.

THe electrochemical polymerization of heterocyclic monomers containing one heteroatom such as furane, thiophen, pyrrole and their substituted derivatives has already been proposed (see U.S. Pat. No. 3,574,072 and Chemica Scripta, 1981, vol. 17, 1-5, pages 145-148).

These polymers include macromolecular hydrocarbon chains having double conjugated bonds, the $\pi$ electrons of which are scattered over a large number of neighboring atoms, and this structure makes it possible to make them conductive by a "doping" operation, by which the macromolecular chain is partially ionized by associating counter ions with it. This operation can also be effected in the course of electrochemical polymer synthesis, by incorporating an ionic element of the electrolyte that is used.

More recently, conductive copolymers of pyrrole and other heterocyclic compounds have been described (European patent application No. 0099984), having a configuration of conjugated electrons of the $\pi$ tykpe, such as furane, thiadiazol and thiophen, for example.

The mechanical strength and electric conductivity of these copolymers is said to be superior to those of the corresponding conductive homopolymers of pyrrole.

Insofar as the above-mentioned polymers and copolymers are synthesized electrochemically (anodic oxidation), one of their most important applications has naturally become the plating of electrodes of the most various kinds.

There are sometimes limits to broadening this field of application: On the one hand, the relatively limited number of monomers used and the quantitative character of the copolymerization makes it difficult to modulate the electrical properties (conductivity) of the polymers obtained; on the other hand, the doping rate that can be attained with these polymers without impairing their stability is relatively low, which is a disadvantage in the case of plating electrodes used in energy storing devices, particularly in rechargeable batteries, so that their specific capacity per unit of weight is inadequate.

The object of the present invention is to provide a novel family of electroconductive polymers which do not have the above-mentioned disadvantages.

To this end, the invention relates to electrically conductive polymers containing recurrent units derived from polycyclic heterocyclic monomers formed of cycles of five condensed members, each cycle of which contains one heteroatom.

The invention also relates to a method for preparing these polymers, in which at least one polycyclic heteroaromatic monomer, formed of cycles of five condensed members, each cycle of which contains one heteroatom, is electrochemically polymerized, by anodic oxidation in a polar solvent and in the presence of an appropriate electrolyte.

The monomers M which can be used to prepare these novel polymers according to the invention thus contain polycyclic heteroaromatic molecules, formed of condensed cycles, each of which contains five members and one heteroatom. These cycles may carry substituents of any arbitrary kind, typically selected from among the alkyl, alkoxy, hydroxyl, aryl, halogenide, cyano, and amino radicals, preferably from among the alkyl radicals, such as the methyl radical, for example.

The heteroatoms which are included in each of the cycles of the heterocyclic monomer, and which may be either identical or different within each cycle, are typically selected from among the atoms of oxygen, sulfur, nitrogen, selenium and phosphorus.

Among these monomers M, the bicyclic monomers formed of two cycles of five condensed members, and in particular those represented by one of the following general formulas, comprise a preferred class:

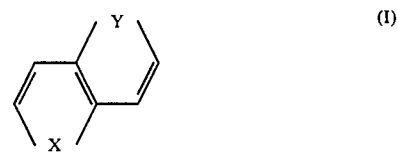

or

in which X and Y may be either identical or different and each represents one atom or group selected from among the —NH group and the atoms of sulfur and selenium.

The family of bicyclic monomers which can preferably be used in accordance with the invention thus include the following compounds:

pyrrolo(2,3-b)pyrrole and pyrrolo(3,2-b)pyrrole, having the following formulas, respectively:

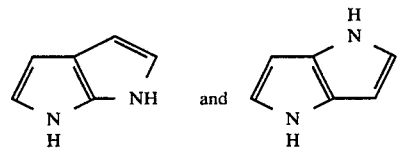

thieno(2,3-b)thiophen and thieno(3,2-b)thiophen, having the following formulas, respectively:

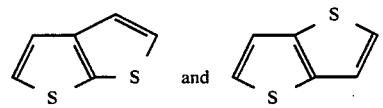

seleno(2,3-b)selenophen and seleno(3,2-b)selenophen, having the following formulas, respectively:

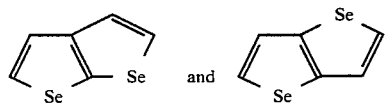

thieno(2,3-b)pyrrole and thieno(3,2-b)pyrrole, having the following formulas, respectively:

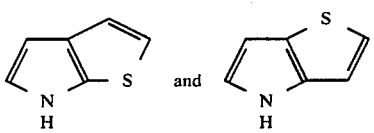

seleno(2,3-b)pyrrole and seleno(3,2-b)pyrrole, having the following formulas, respectively:

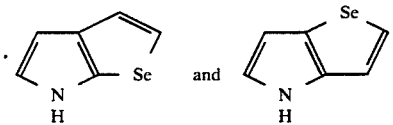

seleno(2,3-b)thiophen and seleno(3,2-b)thiophen, having the following formulas, respectively:

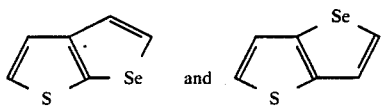

The monomers that can be used according to the invention can be synthesized by known methods (see in particular references 8-13 in the article by R. Gleiter and colleagues in the Journal of Organic Chemistry, vol. 42, no. 13, 1977, pages 2230-2237 and Monat Chem., vol. 103, page 194).

The electroconductive polymers of the invention can be prepared based on the above-mentioned monomers, which are used either alone or in mixtures, in proportions determined by experimentation, depending on the properties desired in the resultant copolymers. According to the invention, these monomers or mixtures of these monomers can also be polymerized in the presence of variable proportions of other comonomers.

Possible examples of similar comonomers are aromatic and heterocyclic cyclic comonomers having 5 to 6 members, such as aniline, pyrrole and thiophen (and their substituted derivatives) and vinyl monomers such as acrylonitrile and acrylamide. It is understood that the possible content of the copolymer in the polymerization medium must be determined experimentally, in such a way as to avoid any deterioration of the electrical and mechanical properties of the polymer.

The preparation of the polymers according to the invention is effected by electrochemical polymerization, generally in an electrolysis outfit, by anodic oxidaton of the monomer or monomers in a polar solvent and in the presence of suitable electrolytes, according to conventional techniques (see, for example, K. K. Kanazawa and colleagues, Synthetic Metals, vol. 1, 1979/80, pages 329-336 and European patent application No. 0099984).

According to these techniques, the monomer concentration is generally between $10^{-3}$ and $10^{-1}$ moles per liter of solvent.

As solvent, polar solvent having solven properties with respect both to the monomer or monomers and to the electrolyte selected, and which are stable in the field of potential applications, are preferably used. Examples of solvents that can be used are acetonitrile, tetrahydrofurane and methylene chloride.

The electrolytes are generally selected from among the conductive salts having the formula $C^+A^-$, in which $C^+$ is a cation and $A^-$ is an anion.

The cation $C^+$ is preferably selected from among the alkaline ions, the ions $R_4N^+$ and $R_4P^+$ (R being an alkyl radical, such as the ethyl and butyl radicals, for example).

The anion $A^-$ is preferably selected from among the ions $ClO^-_6$, $AsF^-_6$, $SbF^-_6$, $SO_4^{2-}$, $C_6H_5COO^-$, $C_6H_5SO^-_3$, $BF^-_4$, $PF^-_6$, $I^-$ and $Br^-$.

Examples of typical electrolytes are the fluoroborates, such as tetrafluoroborate and tetraethylammonium, and the perchlorates, such as perchlorate of lithium.

THe electrolyte concentration is generally between $10^{-2}$ and 1 mole per liter of solvent.

The electrochemical cell in which the polymerization of the monomers can be performed according to the invention may function under either potentiostatic or galvanostatic conditions.

In the first case (potentiostatic control), the cell includes, in addition to the external current source, three electrodes, of which one is a reference electrode for controlling the voltage.

During the electrolysis, a layer of polymer is deposited on the conductor element used as the anode in the electrolysis cell. This anode may be made of a noble metal, such as gold or platinum, or of some other metal, such as copper—perhaps gold-plated or platinum-plated—titanium or nickel. After electrolysis, the result is one electrode comprising a conductive body coated with a film of polymer that adheres to it and which contains a certain proportion of the anion coming from the electrolyte. The chemical composition of this polymer film can be represented by the empirical formula $(M^+A_y)_n$, where M stands for the monomer, $A^-$ stands for the anion or counter ion, y stands for the proportion of anion in the polymer expressed as a monomeric unit (that is, the doping rate), which in the case of the polymers of the invention can easily attain a value of 0.5, and n stands for the degree of polymerization, which is generally impossible to determine easily, considering the insoluble nature of the polymer.

The polymer and the anion thus form a complex with a transfer of charges, the conductivity of which can be widely modulated by selecting the nature of the initial monomer or monomers and can vary between approximately $10^{-3}$ and approximately $10^2 \Omega^{-1} cm^{-1}$.

A preferred variant of the method for preparing the electroconductive polymers according to the invention comprises using an anode in a material selected from among carbon and the organic polymers having double conjugated bonds, with the exception of those derived from polycyclic heterocyclic monomers. These organic polymers are generally selected from among the polymers derived from acetylene, the polymers derived from monocyclic aromatic monomers, such as polyparaphenylene, polyaniline, polysulfide and phenylene polyoxide, for example, and the polymers derived from monocyclic heterocyclic monomers, such as polypyrrole, polythiophen, poly-3-methylthiophen, and polyfurane, for example. The preferred polymers are the polymers derived from acetylene.

These polymers can be made conductive by any known method, such as by positive doping by the action of chemical oxidizing agents, such as the pentafluorides of phosphorus and arsenic and the trichlorides of indium and iron, or by anodic chemical oxidation in a solution of an electrolyte such as those mentioned above.

The preparation of the electroconductive polymers of the invention in the present of an anode in one of the materials defined above produces composite electroconductive material, which likewise comprise a subject of the present invention.

These composite electroconductive materials include an association of a substrate and at least one electroconductive polymer derived from the polycyclic heterocyclic monomers defined above.

The nature of the substrate of these materials is certainly conditioned by the nature of the anode in the presence of which the electrically conductive polymers of the invention have been synthesized. Thus this substrate may generally comprise a metal, carbon, or an organic polymer with double conjugated bonds, such as those defined above. Substrates resulting from the mixture or combination of these ingredients, such as alloys of metals, mixtures of organic polymers, metals recovered from these organic polymers, etc., can also become part of the composition of the electroconductive materials of the invention.

Some applications of the composite electroconductive materials of the invention, used as a substrate, will now be described, by way of non-limiting example.

In the case of metal substrate, these materials can be used as electrodes that are protected against corrosion, such as photoelectrodes used for decomposing water via solar energy.

In the case of carbon substrates, if the carbon is in the form of fibers, for example, then these materials can be used to fabricate microelectrodes for medical uses, because it is possible to produce a microscopic deposit of the electroconductive polymer onto the substrate.

With substrates based on polymers with double conjugated bonds as defined above, the composite electroconductive materials of the invention can be used in all known applications of these polymers, with the advantage that their properties can be modulated to a very great extent by appropriate selection of their nature, the type of doping and the thickness of the electroconductive polymer coating, and on the other hand with the additional advantage that this layer itself protects the polymer comprising the substrate.

This latter advantage is particularly appreciated in the case where the polymer of the substrate is polyacetylene, which is very sensitive to oxidation by the air.

Thus these materials can be used for fabricating photovoltaic cells and positive electrodes for electrical energy storing devices (batteries and piles), whether or not they are rechargeable; in the case of electroconductive polymer coatings that are slightly doped in thin layers, these materials can be used in microelectronics to make junctions, Schottky barrier gates, and transistors, thanks to their semiconductor properties of the n or p type, depending on the nature of the doping. The doping/undoping cycles of these materials can profitably be used in manufacturing optical memory elements, optoelectronic devices, switches, etc.

The invention is illustrated, but not limited, by the following example.

EXAMPLE

1. Polyacetylene is prepared by the method described in J. Poly. Sci., Polym. Chem. Ed., 1974, vol. 12, pages 11-20, and it is doped with ferric chloride as described in the Journal de Physique [Journal of Physics], colloquium C3, supplement to no. 6, volume 44, June 1983, page C 3—3. 2. Thieno(2,3-b)pyrrole, prepared according to H. Hemetsberger and colleagues (Monat Chem., volume 103, 1972, page 194), is electrochemically polymerized by anodic oxidation under potentiostatic conditions in a cell having a compartment through which a 5 mA current passes and which includes three electrodes.

The anode is embodied of doped polyacetylene prepared as indicated in step 1 above, and the voltage of the anode is fixed at 0.8 V with respect to the reference electrode (Ag/AgNO$_3$ 10$^{-1}$M). The cathode is made of gold.

The electrolytic solution comprises tetrafluoroborate of tetraethylammonium (0.1M) and thieno(3,2-b)pyrrole (0.05M) in acetonitrile. This solution is deoxygenated by passing through argon for 30 minutes prior to polymerization. Polymerization is performed for 5 minutes in an argon atmosphere.

At the end of the experiment, the material obtained comprises the anode coated with a gray film of polythienopyrrole and having a specific conductivity on the order of 100$\Omega^{-1}$ cm$^{-1}$.

We claim:

1. An electrically conductive polymer containing recurring units derived from polycyclic heterocyclic monomers formed of condensed rings of five members, of which each ring contains one heteroatom.

2. A conductive polymer as defined by claim 1, characterized in that the polycyclic heterocyclic monomers are bicyclic monomers formed of two condensed rings of five members represented by one of the following general formulas:

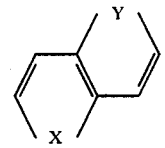

(I)

or

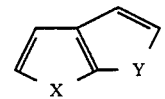

(II)

in which X and Y are identical or different and each represents one atom or group, selected from among the —NH group, sulfur and selenium.

3. A conductive polymer as defined by claim 2, wherein the bicyclic monomers are selected from the group consisting of pyrrolo(2,3-b)pyrrole, pyrrolo(3,2-b)pyrrole, thieno(2,3-b)thiophen, thieno(3,2-b)thiophen, seleno(2,3-b)selenophen, seleno(3,2-b)selenophen, thieno(2,3-b)pyrrole, thieno(3,2-b)pyrrole, seleno(2,3-b)pyrrole, seleno(3,2-b)pyrrole, seleno(2,3-b)thiophen and seleno(3,2-b)thiophen.

4. Conductive polymers as defined by claim 1, characterized in that the rings forming the polycyclic heterocyclic monomers are substituted.

5. Conductive polymers as defined by claim 4, wherein the polycyclic heterocyclic monomers are substituted with a radical selected from the group consisting of alkyl, alkoxy, hydroxyl, aryl, halogenide, cyano and amino radicals.

6. An electrically conductive polymer as defined in claim 1, wherein the polycyclic heterocyclic monomers from which the polymer is derived are mixed with comonomers, which are included in the recurring units of the polymer.

7. An electrically conductive polymer as defined in claim 6, wherein the comonomers are at least one comonomer selected from the group consisting of aromatic comonomers, heterocyclic comonomers having 5 or 6 members, and vinyl monomers.

8. A method for preparing electroconductive polymers, characterized in that at least one polycyclic heterocyclic monomer formed of condensed rings of five members, of which each ring contains one heteroatom, is electrochemically polymerized by electrolytic oxidation in a polar solvent and in the presence of a suitable electrolyte.

9. A method as defined by claim 8, characterized in that the polycyclic heterocyclic monomer is a bicyclic monomer formed of two condensed rings of five members represented by one of the following general formulas:

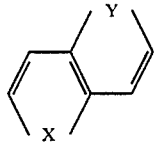
(I)

or (II)

in which X and Y are identical or different and each represents one atom or group selected from among the —NH group, sulfur and selenium.

10. A method according to claim 8, characterized in that the monomer is electrochemically polymerized by electrolytic oxidation on a carbon anode.

11. A method according to claim 8, characterized in that the monomer is electrochemically polymerized by electrolytic oxidation on an anode made of an organic polymer having double conjugated bonds, with the exception of those derived from polycyclic heterocyclic monomers.

12. As method as defined by claim 11, characterized in that the organic polymer having double conjugated bonds is a polymer derived from acetylene.

13. A composite electroconductive material comprising a substrate layer and at least one polymer layer in which the polymer is an electrically conductive polymer containing recurring units derived from polycyclic heterocyclic monomers formed of condensed rings of five members, of which each ring contains one heteroatom.

14. A material according to claim 13, characterized in that the polymer is derived from bicyclic monomers formed of two condensed rings having five chains represented by one of the following general formulas:

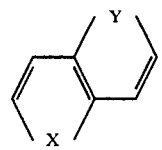
(I)

or

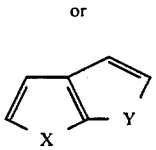
(II)

in which X and Y are identical or different and each represents one atom or group, selected from among the —NH group, sulfur and selenium.

15. A material according to claim 13, characterized in that the substrate comprises at least one metal.

16. A material according to claim 13, characterized in that the substrate comprises carbon fibers.

17. A material according to claim 13, wherein the substrate comprises a polymer having double conjugated bonds, which is not derived from polycyclic heterocyclic monomers.

18. A materials as defined by claim 17, characterized in that the organic polymer is of polyacetylene made conductive by means of positive doping.

* * * * *